(12) United States Patent
Murji (10) Patent No.: US 8,483,633 B2
(45) Date of Patent: Jul. 9, 2013

(54) METHOD AND APPARATUS FOR ALARMING IN A POWER SUPPLY MODULATED SYSTEM

(75) Inventor: Rizwan Murji, Chicago, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 281 days.

(21) Appl. No.: 12/842,223

(22) Filed: Jul. 23, 2010

(65) Prior Publication Data

US 2012/0021708 A1    Jan. 26, 2012

(51) Int. Cl.
*H04B 1/04* (2006.01)
*H04B 17/00* (2006.01)

(52) U.S. Cl.
USPC .................................. 455/127.1; 455/115.1

(58) Field of Classification Search
USPC ................... 455/108, 115.1, 117, 126, 127.1, 455/115.2, 116
See application file for complete search history.

(56) References Cited

U.S. PATENT DOCUMENTS

| | | | |
|---|---|---|---|
| 5,111,158 A | 5/1992 | Malec et al. | |
| 5,847,602 A | 12/1998 | Su | |
| 5,854,971 A | 12/1998 | Nagoya et al. | |
| 5,977,831 A * | 11/1999 | Davis et al. | 330/279 |
| 6,006,075 A | 12/1999 | Smith et al. | |
| 6,043,707 A | 3/2000 | Budnik | |
| 6,084,468 A | 7/2000 | Sigmon et al. | |
| 6,138,042 A | 10/2000 | Midya et al. | |
| 6,141,541 A | 10/2000 | Midya et al. | |
| 6,161,024 A | 12/2000 | Komara | |
| 6,215,988 B1 | 4/2001 | Matero | |
| 6,242,975 B1 | 6/2001 | Eidson et al. | |
| 6,256,482 B1 | 7/2001 | Raab | |
| 6,275,103 B1 | 8/2001 | Maniwa | |
| 6,353,359 B1 | 3/2002 | Leizerovich | |
| 6,437,641 B1 | 8/2002 | David et al. | |
| 6,438,360 B1 | 8/2002 | Alberth, Jr. et al. | |
| 6,529,716 B1 | 3/2003 | Eidson | |
| 6,531,917 B2 | 3/2003 | Yamamoto et al. | |
| 6,580,901 B1 | 6/2003 | Mochizuki | |
| 6,606,483 B1 | 8/2003 | Baker et al. | |
| 6,839,549 B2 | 1/2005 | Pehlke et al. | |
| 7,164,893 B2 | 1/2007 | Leizerovich et al. | |
| 7,443,244 B2 * | 10/2008 | Hagen | 330/285 |
| 7,454,179 B1 | 11/2008 | Lee | |
| 7,457,595 B2 | 11/2008 | Schoofs et al. | |
| 7,483,681 B2 | 1/2009 | Grillo et al. | |
| 7,551,688 B2 | 6/2009 | Matero et al. | |
| 7,715,811 B2 | 5/2010 | Kenington | |

(Continued)

OTHER PUBLICATIONS

Notice of Allowance Dated Dec. 13, 2012 for Related U.S. Appl. No. 12/842,246.

*Primary Examiner* — Blane J Jackson
(74) *Attorney, Agent, or Firm* — Anthony P. Curtis; Daniel R. Bestor (57) ABSTRACT

A communication device is presented that has different processors and a power amplifier. One of the processors receives a signal from a monitor and indicates that an alarm exists to a diagnostics module. The other processor uses the envelope signal of the input signal to be amplified and either the signal from the diagnostics module, the monitor or the power amplifier to adjust modulation of the power supply of the power amplifier dependent on the type of alarm. The power supply voltage or headroom is maximized or frozen at the value of the last detection cycle if a fault or impairment, respectively, of the power amplifier is detected.

18 Claims, 8 Drawing Sheets

U.S. PATENT DOCUMENTS

| | | |
|---|---|---|
| 8,014,738 B2 * | 9/2011 | Camuffo et al. ........... 455/127.1 |
| 8,160,517 B2 * | 4/2012 | Chan et al. ................... 455/126 |
| 8,224,399 B2 | 7/2012 | Lee et al. |
| 2004/0127173 A1 | 7/2004 | Leizerovich |
| 2006/0128324 A1 | 6/2006 | Tan et al. |
| 2006/0199553 A1 | 9/2006 | Kenington |
| 2007/0178856 A1 | 8/2007 | Mitzlaff et al. |
| 2010/0112967 A1 | 5/2010 | Sorensen |

* cited by examiner

METHOD AND APPARATUS FOR ALARMING IN A POWER SUPPLY MODULATED SYSTEM

TECHNICAL FIELD

The present application relates to a power amplifier and in particular to a power amplifier whose power supply is modulated.

BACKGROUND

With the ever-increasing demand for portable communication devices, reliability and efficiency of both user devices and devices in the supporting network has become of increasing importance. There are a number of different considerations, related to both individual elements as well as system elements, which affect these characteristics. For example, it is desirable to increase both bandwidth efficiency and power efficiency of a power amplifier in various communication devices. While bandwidth efficiency (the rate that data can be transmitted over a given bandwidth) is typically achieved using linear modulation, amplifier efficiency is a significant concern for achieving longer battery life and lower energy costs in transmitters as it usually dominates the power consumption in the system.

A transmitter of the portable communication device or of a communication device in the infrastructure (such as a base station) generally uses a radio frequency power amplifier (RFPA) as the final amplifying stage of a transmitter. The RFPA typically has a fixed power supply voltage. With a fixed supply voltage, however, the efficiency of the RFPA decreases as the output signal magnitude drops, leading to ineffectiveness and excessive peak power capability. To improve efficiency, it is desirable for the RFPA to continually operate near saturation, where the amplifier is close to or slightly gain compressed (about 0.5 dB below gain compression to 0.5 dB in gain compression). This can be achieved by modulating the power supply of the RFPA using the known technique of envelope tracking (i.e. the supply voltage of the RFPA tracks the output signal of the RFPA), which adjusts the power supply of the RFPA such that the power supply voltage of the RFPA follows the output signal thereby allowing the RFPA to continually operate near saturation.

While it is usually desirable in using power supply modulation for the RFPA to continually operate near saturation, this may be undesirable when certain unexpected situations arise within the circuitry of the communication device. These conditions, hereinafter referred to as alarm conditions or merely alarms, include significant thermal increases (one type of impairment) or the failure of one or more transistors or other components within the power amplifier module. Under circumstances such as the above impairment or failure, a significant degradation in adjacent channel power (ACP) or other similar issues that cause the power amplifier to operate at a reduced performance (below desired specification) occur if the modulated supply were to operate at a level determined before the impairment or failure. An impairment or failure may also cause the communication device to fail regulatory requirements set by the FCC. Accordingly, when an alarm occurs the output power is thus reduced to avoid such problems.

However, if a false alarm occurs, causing a reduction in the output power, the power supply modulator will converge to this lower output power in order to maintain operation near saturation. Although the RFPA cuts back in power, the supply voltage level should remain at its current level. When the alarm is cleared, the RFPA will attempt to be set back to full power. Unfortunately, an insufficient amount of time exists to return to the power supply to its optimal level before a significant degradation in ACP occurs if the supply modulator has converged to maintain operation near saturation during a false alarm.

Therefore, a need exists for improved control of modulation of a power supply voltage to a power amplifier in order for the power amplifier to maintain high efficiency and that allows the power supply modulator implementation to adapt to various non-ideal conditions that may arise in the communication device.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of the embodiments of shown.

The apparatus and method components have been represented where appropriate by conventional symbols in the drawings, showing only those specific details that are pertinent to understanding the embodiments shown so as not to obscure the disclosure with details that will be readily apparent to those of ordinary skill in the art having the benefit of the description herein. Other elements, such as those known to one of skill in the art, may thus be present.

DETAILED DESCRIPTION

Before describing in detail the various embodiments, it should be observed that such embodiments reside primarily in combinations of apparatus components related to a power amplifier module in which parameters of a power amplifier are used to determine whether an alarm exists and if so alter modulation of the supply voltage of the power amplifier dependent on the type of alarm. Power supply voltage characteristics, which are defined herein as the power supply voltage or the headroom between the maximum of the RF input signal and the power supply voltage, are frozen if impairment is detected or maximized if a fault is detected. Thus, if an alarm is present, in most cases the power supply voltage or headroom is adjusted to back away from maintaining the power amplifier near saturation.

Figure 1:
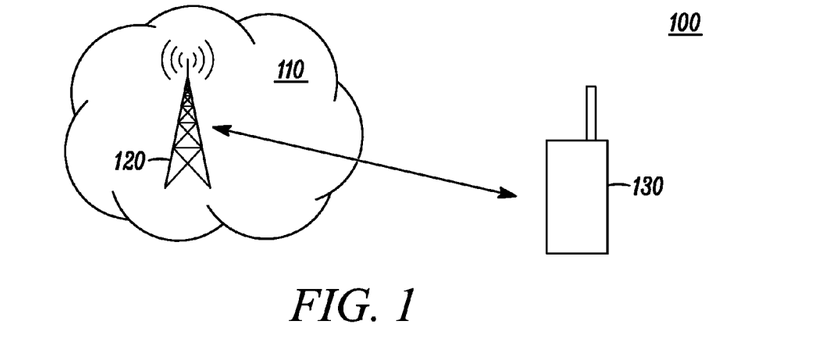
FIG. 1 illustrates an embodiment of a communication system.

FIG. 1 illustrates a general network 100 that includes an infrastructure 110. There are many distributed elements in the infrastructure 110, some local to each other others disposed geographically distant from each other. Such elements include a base station 120, which provides connectivity for a portable communication device 130 disposed within the coverage area serviced by the base station 120 to other devices either in the same coverage area or in a different coverage area through the infrastructure 110. The portable communication device 130 can be, for example, a cellular telephone, personal digital assistant, or a communication device used by emergency personnel.

Figure 2:
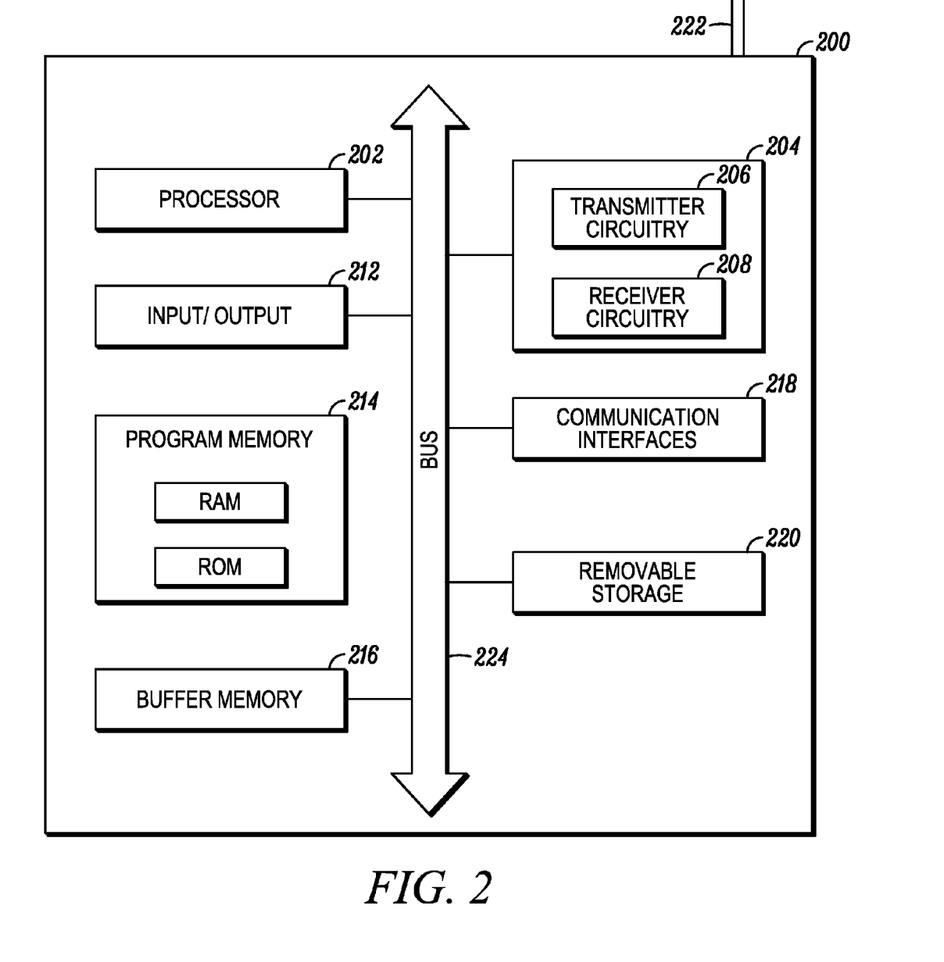
FIG. 2 illustrates an internal block diagram of an embodiment of a communication device.

An embodiment of one such communication device, such as the base station 120, is shown in the block diagram of FIG. 2. The base station 200 may contain, among other components, a processor 202, a transceiver 204 including transmitter circuitry 206 and receiver circuitry 208, an antenna 222, I/O devices 212, a program memory 214, a buffer memory 216, one or more communication interfaces 218, and removable storage 220. The base station 200 is preferably an integrated unit and may contain at least all the elements depicted in FIG. 2 as well as any other element necessary for the base station 200 to perform its electronic functions. The electronic elements are connected by a bus 224.

The processor 202 includes one or more microprocessors, microcontrollers, DSPs, state machines, logic circuitry, or any other device or devices that process information based on operational or programming instructions. Such operational or programming instructions are stored in the program memory 214 and may include instructions such as estimation and correction of a received signal, encryption/decryption, and decisions about whether an alarm exists as described herein that are executed by the processor 202 as well as information related to the transmit signal, such as modulation, transmit frequency or signal amplitude. The program memory 214 may be an IC memory chip containing any form of random access memory (RAM) and/or read only memory (ROM), a floppy disk, a compact disk (CD) ROM, a hard disk drive, a digital video disk (DVD), a flash memory card or any other medium for storing digital information. One of ordinary skill in the art will recognize that when the processor 202 has one or more of its functions performed by a state machine or logic circuitry, the memory 214 containing the corresponding operational instructions may be embedded within the state machine or logic circuitry. The operations performed by the processor 202 and the rest of the base station 200 are described in detail below.

The transmitter circuitry 206 and the receiver circuitry 208 enable the base station 200 to respectively transmit and receive communication signals. In this regard, the transmitter circuitry 206 and the receiver circuitry 208 include appropriate circuitry to enable wireless transmissions. The implementations of the transmitter circuitry 206 and the receiver circuitry 208 depend on the implementation of the base station 200 and the devices with which it is to communicate. For example, the transmitter and receiver circuitry 206, 208 may be implemented as part of the communication device hardware and software architecture in accordance with known techniques. One of ordinary skill in the art will recognize that most, if not all, of the functions of the transmitter or receiver circuitry 206, 208 may be implemented in a processor, such as the processor 202. However, the processor 202, the transmitter circuitry 206, and the receiver circuitry 208 have been artificially partitioned herein to facilitate a better understanding. The buffer memory 216 may be any form of volatile memory, such as RAM, and is used for temporarily storing received or transmit information.

The base station 200 may also contain a variety of I/O devices such as a keyboard with alpha-numeric keys, a display (e.g., LED, OELD) that displays information about the base station or communications connected to the base station, soft and/or hard keys, touch screen, jog wheel, a microphone, and a speaker. Again, although the device discussed with relation to the figures is specifically referred to the base station, other communication devices that employ a power amplifier may be used.

Figure 3:
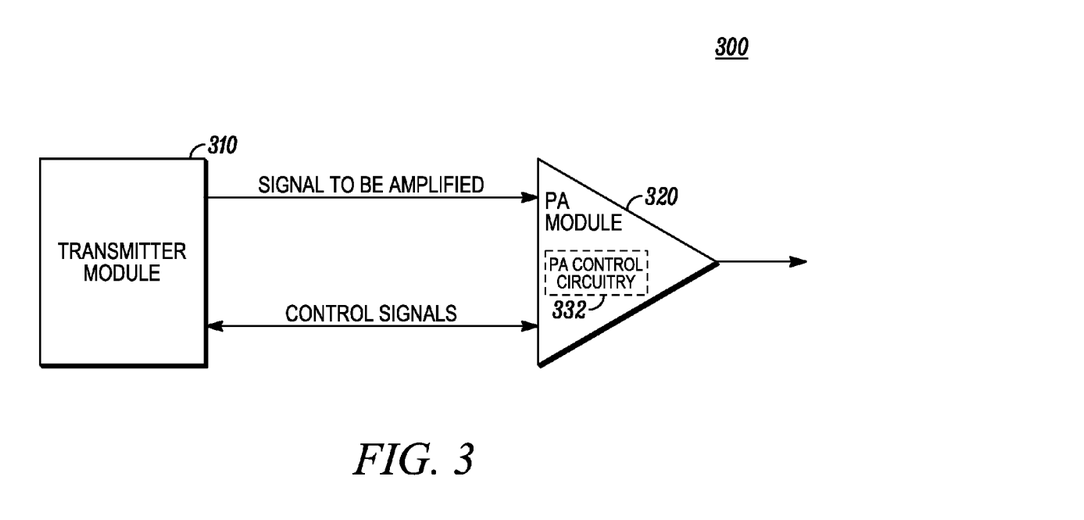
FIG. 3 illustrates a block diagram of an embodiment of the communication device of FIG. 2.

As shown in the simplified block diagram of FIG. 3, the transmitter portion of the base station 300 contains a transmitter module 310 and a power amplifier (PA) module 320. The transmitter module 310 supplies signals to be power amplified (the final stage of amplification) to the PA module 320. The PA module 320 also contains PA control circuitry 322. The PA control circuitry 322 enables the transmitter module 310 and PA module 320 to exchange control signals including alarm conditions from the PA module 320 to the transmitter module 310, and alert instructions and envelope modulation signals from the transmitter module 310 to the PA module 320.

Figure 4:
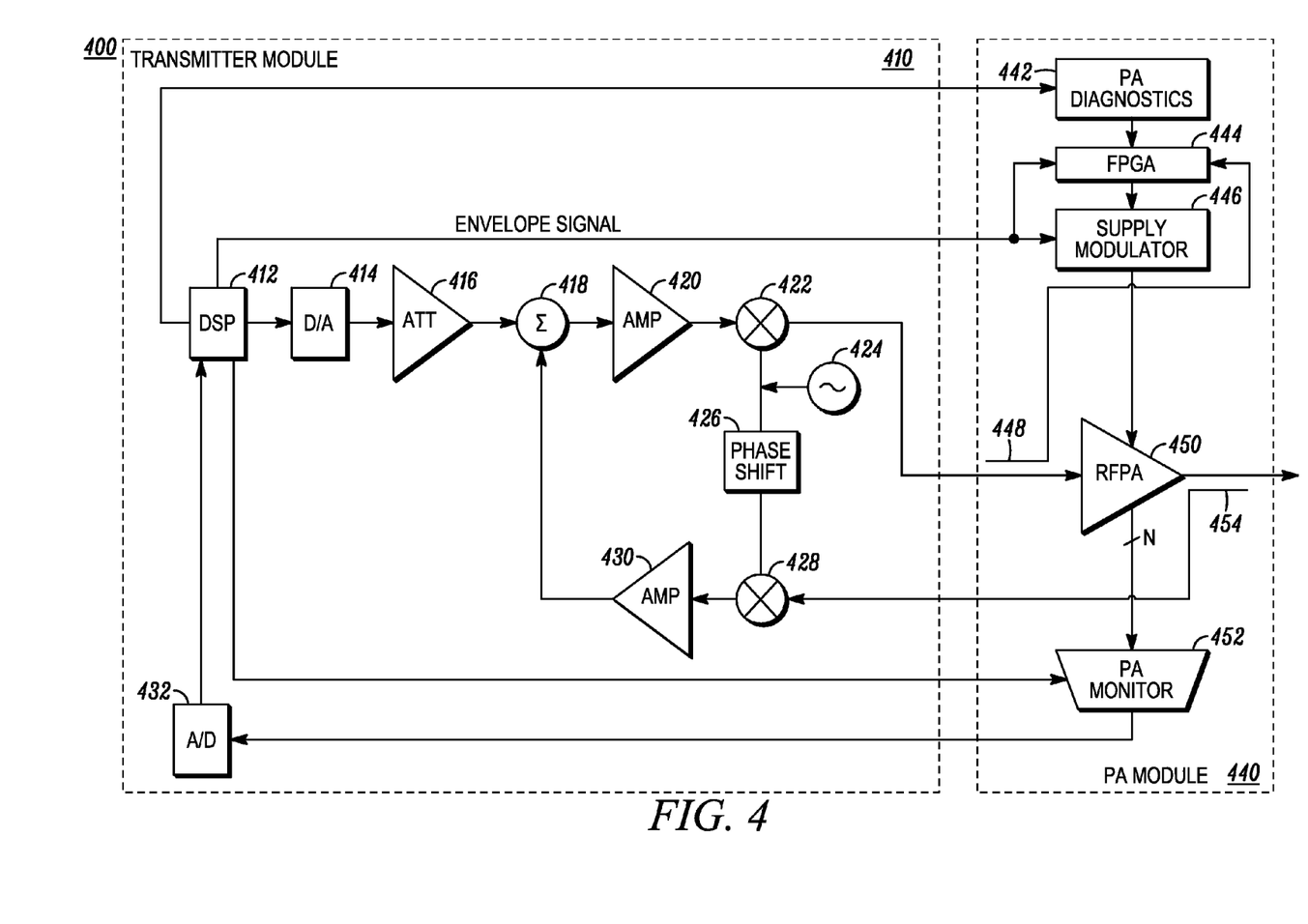
FIG. 4 illustrates a block diagram of an embodiment of the communication device of FIG. 3.

The transmitter module and PA module are shown in more detail in the transceiver 400 of FIG. 4. The transceiver 400 contains a transmitter module 410 and PA module 440. The transmitter module 410 has a digital signal processor (DSP) or other microprocessor 412. The DSP 412 provides a digital signal to be transmitted, which is then converted to an analog signal by a digital-to-analog (D/A) converter 414. Although the DSP 412 may generate in-phase (I) and quadrature-phase (Q) baseband signals, as well known in the art, only one such signal is shown in FIG. 4 for convenience.

The I and Q signals from the DSP 412 are attenuated by an attenuator 416, which may be passive or active. The attenuated signals are supplied to a summer 418, which sums the attenuated signals with baseband signals from a feedback loop. The summed signals are amplified by an amplifier 420 and then upconverted to transmission frequency by a modulator 422, which creates a low power RF signal according to a modulation scheme. The summed signals may be upconverted directly, as shown, or through an intermediate frequency. The modulator 422 is supplied with a carrier signal from an oscillator 424. As above, as only one signal is shown, the 90° phase shifter used to provide signals to modulate the Q signal is not shown. Although a transmitter configuration using Cartesian feedback is shown, other implementations such as polar feedback, pre-distortion, or feed-forward implementations may be used.

The low level RF signal from the modulator 422 is provided to an RFPA 450 in the PA module 440. Other amplification and/or attenuation stages in the transmitter module 410 and/or PA module 440 have been omitted in FIG. 4 for clarity.

The RFPA 450 in the PA module 440 provides power amplification of the low level RF signal for transmission. A coupler 454 couples the output from the RFPA 450, which is then fed back to the transmitter module 410. The analog signal from the coupler 454 is supplied to a demodulator 428, where it is demodulated from the transmission frequency to baseband. The signal from the coupler 454 may be amplified and/or attenuated prior to being demodulated. One or more phase shifters 426 provide a predetermined phase shift of the carrier signal from the oscillator 424. This phase shift is used to compensate the I and Q signals for the individual path delays in the Cartesian feedback loop as well as the overall loop delay. The baseband signal is then amplified by a feedback amplifier 430 before being supplied to the summer 418, where it is used to linearize the signal to be transmitted.

The PA module 440 also contains a PA diagnostic module 442, a processor such as a floating-point gate array (FPGA) or complex programmable logic device (CPLD) 444, a power supply modulator 446, an input coupler 448, and a PA monitor 452. The coupled signal from input coupler 448 is an RF signal that is fed to, for example, an envelope detector (not shown). The envelope detector produces a detected envelope of the input signal is fed to the FPGA 444. Such envelope detectors are known in the art and thus will not be described in further detail herein. The DSP 412 in the transmitter module 410 supplies envelope information to the FPGA 444 and the power supply modulator 446. In another embodiment, rather than the DSP 412 providing the envelope of the signal to be transmitted, another envelope detector may receive the signal to be transmitted from the DSP 412 (in addition to the D/A converter 414) and provide the envelope to the FPGA 444 and the power supply modulator 446. The DSP 412 also provides one or more signals to the PA diagnostic module 442. The various digital signals from the DSP 412 are converted to analog signals through D/A converter 414. The PA diagnostic module 442 provides a diagnostic signal to the FPGA 444, which is also supplied with a signal from the input coupler 448. Although the input coupler 448 is shown as coupling the signal supplied to the RFPA 450, it can be placed anywhere along the forward path of the feedback loop (i.e., after the output of the summer 418).

The FPGA 444 includes a program for implementing power supply modulation based on alarm conditions. The signal from the FPGA 444 is provided to the power supply modulator 446. The power supply modulator 446, which may be a fast acting DC to DC converter, modulates the RFPA power supply level. Such converters are known in the art, and provide an output corresponding to a reference signal, which as shown in FIG. 4 is the analog envelope signal provided by the DSP 412. Alternatively, a digital signal corresponding to the analog envelope signal may be supplied to the power supply modulator 446 by the DSP 412.

Various conditions (e.g., voltage levels) within the RFPA 450 are monitored by the PA monitor 452, one of which is selected by the DSP 412. This monitored signal is supplied to the DSP 412 through an A/D converter 432, which is disposed for example as shown in the transmitter module 410. The PA monitor 452 may be a multiplexer or may include, for example, a failure sensor and a temperature sense circuit. The sensor may, for example, measure one or more transistor voltages in the RFPA 450, while the temperature sense circuit may contain a resistive divider with one leg of the divider being a thermistor. The output from the PA monitor 452 is compared to one or more predetermined levels in the DSP 412. Each set of levels may be different depending on what is being monitored by the PA monitor 452. Furthermore, the levels for one condition being monitored may change depending on whether an alarm has been indicated by another condition. Note that the functionality of the DSP 412 may be split in various ways with the FPGA 444 or a main processor (not shown) in the transmitter but external to the Transmitter module 410 and PA module 440.

In one embodiment, the DSP 412 selects the output of the PA Monitor 452. This selection can be performed cyclically, with each condition being monitored at a uniform interval (e.g., each different output is selected for n ms). The timing for the monitoring may remain the same whether various alarm conditions exist or may change dependent on the particular alarm. For example, in the latter case, if a thermal sensor indicates that an alarm has occurred, the DSP 412 may cycle through one or more of the conditions (e.g., temperature but not failure or temperature and failure of one component in the PA module 440 but not of another component in the PA module 440) so that particular conditions are monitored more often than if the alarm did not exist. Once the alarm terminates, the original timing can be restored gradually (through several cycles) or immediately at the next cycle.

The DSP 412 determines that an alarm exists by comparing one of the monitored signals to a predetermined range (a high limit and a low limit) programmed into the DSP 412 and finding that the signal is no longer within the predetermined range. If the DSP 412 decides that an alarm has occurred, it determines the type of alarm and sends a signal dependent on the type of alarm to the PA diagnostic module 442 in the PA module 440. The PA diagnostic module 442 uses the signal to determine which alarm is to be indicated on a display. In one embodiment, this display is local to the communication device, as described in reference to FIG. 2. In other embodiments, additional displays can be provided that are remote to the communication device, either in the same general geographic area (e.g., within a few feet of or in the same building as the communication device) or may be disposed elsewhere (e.g., at a monitored console in the infrastructure to which the communication device is connected).

The output from the PA diagnostic module 442 is provided to the FPGA 444. The FPGA 444 determines which alarm exists (from the signal from the PA diagnostic module 442) and the manner in which the power supply modulation should be adjusted. To control the power supply level, the FPGA 444 also receives the envelope signal from the DSP 412 and the signal from the input coupler 448 to determine the current power supply modulation setting of the power supply modulator 446 and selects the appropriate supply modulated voltage level for the RPFA. Once this level is selected, the FPGA 444 controls the power supply modulator 446 to limit the level through a control signal sent to the power supply modulator 446.

In this way, in the embodiment shown in FIG. 4 the transmitter module 410 and the PA module 440 are able to operate essentially independent of each other. This is to say that independent of whether or how the PA Module 440 is altering the power supply voltage, the transmitter module 410 receives the same signals from and sends the same signals to the PA module 440. Thus, in the embodiment shown, the DSP 412 receives data from the PA monitor 452, the software in the DSP 412 decides whether an alarm exists, and signals the PA module 440 to indicate which type of alarm exists, independent of whether the PA module 440 adjusts the power supply modulation level—the transmitter module 410 does not determine how the alarm affects the power supply modulation level. The PA module 440 indicates the type of alarm on the display and uses this indication to determine the power supply modulation level. Thus, if adjustment of the power supply modulation level is not desired, the PA module 440 can be replaced by another PA module that does not contain the FPGA 444 (as well as other supporting circuitry)—i.e., one that does not require software changes in the DSP when operating in PSM mode—or contains a circuit that disengages the FPGA 444 from the power supply modulator 446.

In other embodiments, the programming in the DSP 412 of the transmitter module 410 may be altered to determine the type of alarm and adjust the power supply modulation level accordingly before providing the signal to the power supply modulator 446. In this case, the power supply modulation adjustment intelligence resides in the transmitter module 410 rather than the PA module 440.

Figure 5:
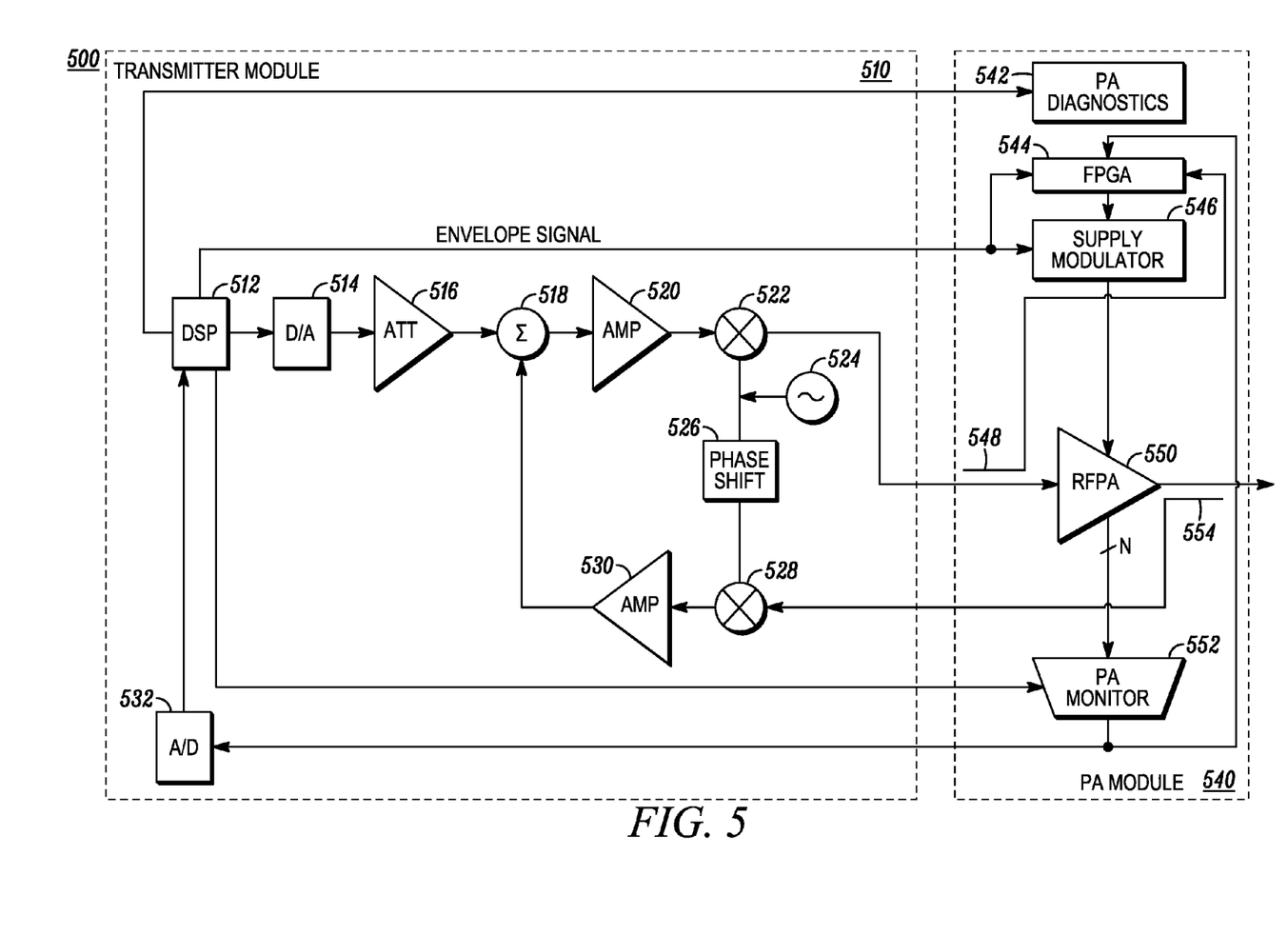
FIG. 5 illustrates a block diagram of an embodiment of the communication device of FIG. 3.

In other embodiments, the PA module independently monitors signals into or from the PA monitor. In FIG. 5, the PA module 540 of the transmitter 500 independently monitors the individual condition from the PA monitor 552 selected by the DSP 512, while in FIG. 6, the PA module 640 of the transmitter 600 independently monitors the various conditions inputed to the PA monitor 652. In either of these embodiments, rather than relying on the signal from the DSP 512, 612 to the PA diagnostic module 542, 642 to determine whether or not the power supply modulation level should be adjusted, the PA module 540, 640 determines the power supply modulation level independent of whether an alarm is to be displayed on the display of the communication device (which is controlled by the DSP 512, 612 in the transmitter module 510, 610 to display the alarm). In other embodiments, the PA Diagnostics module 542, 642 may not receive a signal from the DSP 512, 612 and the FPGA 544, 644 may determine whether an alarm exists and the type of alarm from the output of the RFPA 550, 650 and/or PA monitor 552, 652. These arrangements thus permit independent conditions to be set for display of the alarm and adjustment of the power supply modulation level.

Figure 6:
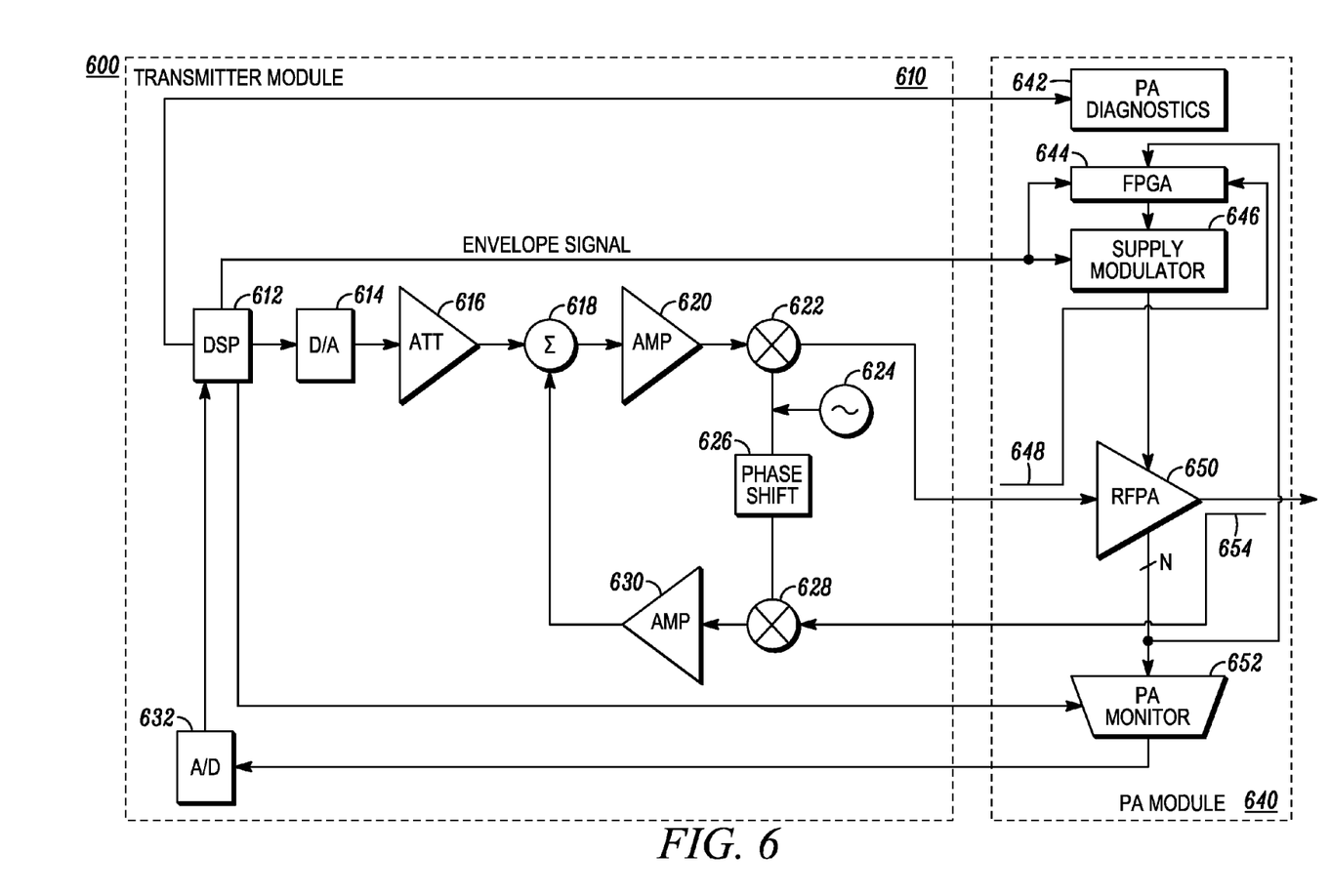
FIG. 6 illustrates a block diagram of an embodiment of the communication device of FIG. 3.

In general, the other components shown in FIGS. 5 and 6 operate in a manner similar to that described in FIG. 4. The FPGA 544, 644 may be programmed to provide the functionality of the DSP with regards to determination of whether and which type of alarm exists. Alternatively, the FPGA 544, 644 may be replaced with a simple processor or a separate processor (or multiplexer/processor combination in FIGS. 5 and 6) may be used in combination with the FPGA 544, 644 to provide the DSP functionality. In each of the embodiments of FIGS. 4-6, the FPGA receives one or more signals dependent on the existence of an alarm (the type of alarm from the PA diagnostic module, the envelope signal from the DSP, the signal from the RFPA, or the signal from the PA monitor) and in response controls the power supply voltage characteristics by controlling the power supply modulator.

Turning to the alarms, the DSP in each of the embodiments monitors the PA monitor and informs the PA diagnostic module whether the PA module is operating within the desired parameters, whether a signal is being amplified/transmitted by the PA module, whether the PA module is impaired (i.e., the output power cannot be set to the desired power or for example FCC regulations may be exceeded), or whether a PA fault has occurred.

A fault (device failure) in the PA module is permanent and is only corrected if the device failing is replaced. When a fault is determined in the PA module, the power supply voltage is set to the maximum value (the rail voltages) so that the RFPA backs away from saturation at all points (e.g., 2.8 dB lower or any other predetermined level). In a different embodiment, when a fault is detected, rather than set the power supply to the maximum power supply, another predetermined fixed voltage lower than the maximum but higher than the optimal voltage (the voltage at which the RFPA operates near saturation) and impairment voltage (i.e., $V_{supply\_optimal} < V_{supply} < V_{supply\_max}$) can be used. Alternative embodiments are described below.

Impairment of the PA module may not be permanent, in which case the PA may be capable of correcting the cause of the impairment or the cause of the impairment may eventually end naturally. When impairment of the PA module is determined, the power supply voltage is at least initially set to its last impairment-free value. The power supply voltage may remain constant, frozen at the level of the immediately previous cycle, or modulation of the power supply voltage is set such that a predetermined amount of headroom between the maximum of the new (reduced) RF input signal and the power supply voltage is maintained. This headroom is thus increased from that of the previous cycle and to the extent that the RFPA is not saturated. As defined herein, the term cycle is the loop to determine the condition, determine whether an alarm exists, take the appropriate action, and wait until the next time to determine the condition.

The various alarms and disposition of the power supply voltage are shown in Table 1. In this table, VSWR refers to the voltage sanding wave ratio and is a measure of the load nominal to an ideal 50 ohm load. When this alarm occurs, no action is taken as it is for indication only (although this need not be the case). The High Reverse Power alarm is an indication of how much reverse power the RPFA sees. This alarm is activated if the reverse power is greater than a set threshold level. The Final Failure alarms refer to an RFIC failing within the RFPA. When this occurs, both the PA Impaired and PA Fault alarms are set. The PA Internal Temp alarm is an indication that the internal temperature of the RPFA has surpassed a threshold temperature. The PA DC, 3.3V $V_b$ and $V_{driver}$ supply alarms indicate that the corresponding power supply is not operating within its predefined low and high limits. Note that for certain alarms, even though the alarm exists (and may be displayed), the power supply modulation is not altered.

TABLE 1

Alarms and results

| Active Alarm | PA Impaired | PA Fault | No Action |
|---|---|---|---|
| VSWR | | | X |
| High Reverse Power | X | | |
| Final Failure | X | X | |
| Final$_A$ Failure | X | X | |
| PA Internal Temp | X | | |
| PA DC Supply | X | | |
| PA 3.3 V Supply | X | | |
| PA + V$_b$ Supply | X | | |
| PA + V$_{driver}$ Supply | X | | |
| Driver Failure | X | X | |

The current state of the PA module, affecting the supply voltage level, is determined by monitoring the signal(s) to the PA diagnostic module. As above, different signals can be used to indicate that the PA module is operating correctly and/or is currently amplifying, impaired, or contains a fault. Alternatively, a single signal with different voltage levels (e.g., 0-0.5 mV=operating correctly, 0.5-1.0 mV=impaired . . . ) and/or with the different conditions being indicated at different periods by, e.g., a voltage corresponding to a 0 or 1 (e.g., $t_1$-$t_2$=operating correctly [low]/amplifying [high], $t_2$-$t_3$=impaired [low]/fault [high]) may be used to indicate the different conditions.

By retaining the last power supply voltage (or modulating around this level) if an impairment is detected only until the alarm has ended, and by permanently maximizing the voltage supply level if a fault (e.g., permanent device failure) is detected, the problems associated with false or temporary alarms can be avoided. The operating parameter and resulting power supply modulation as the input signal varies are shown in FIGS. 7A and 7B for normal operation, impairment alarm, and fault alarm.

Figure 7A:
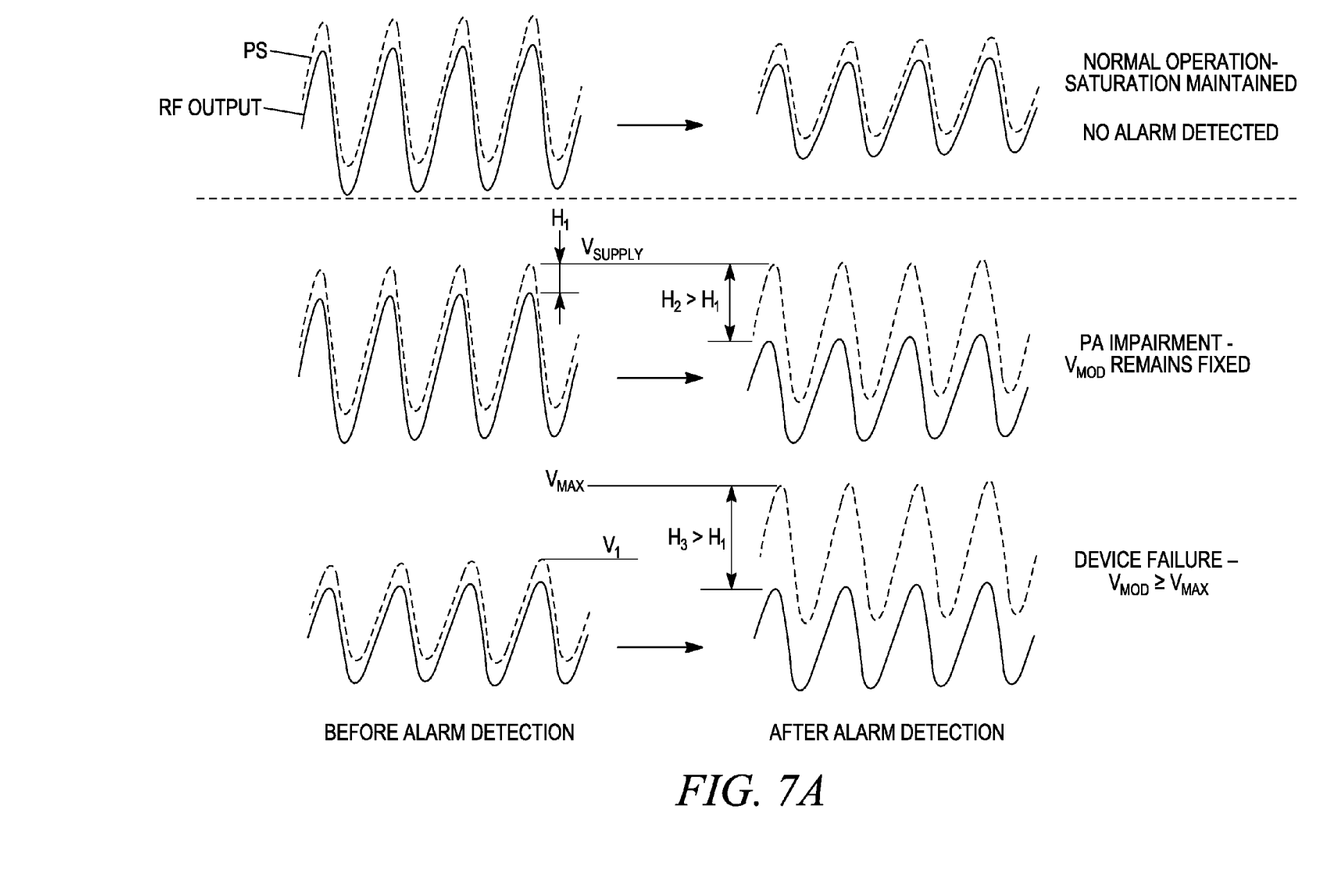
FIGS. 7A and 7B illustrate RF input/output signals and power supply voltage according to different embodiments.

As shown in FIG. 7A, when no alarm is detected (normal operation), the power supply voltage (dashed line) continually matches the input/output RF signal (solid line) so that saturation of the RFPA is continually maintained. This is shown by the voltage curves above the dashed line. The voltage curves below the dashed line illustrate one embodiment of when an impairment and fault are detected. When impairment of the RFPA is detected, the power supply voltage is maintained at the current level ($V_{supply}$) even though the RF input signal voltage has decreased. In this case, as the RF input signal decreases, the RFPA moves out of saturation as the amount of headroom has increased from $H_1$ to $H_2$. This amount of headroom is maintained. If the alarm turns out to be a false alarm or the parameter leading to the alarm terminates, modulation of the power supply voltage then unlocks and once again matches the RF input signal closely enough such that the RFPA is near saturation, i.e., the amount of headroom returns to $H_1$. When a fault in the RFPA is detected, modulation of the power supply voltage is permanently changed until the problem is fixed (e.g., the broken transistor is replaced) so that the maximum power supply voltage ($V_{max}$) is reached when the RF input signal is a maximum, the amount of headroom is maximized at $H_3$ and the RFPA does not enter saturation.

Figure 7B:
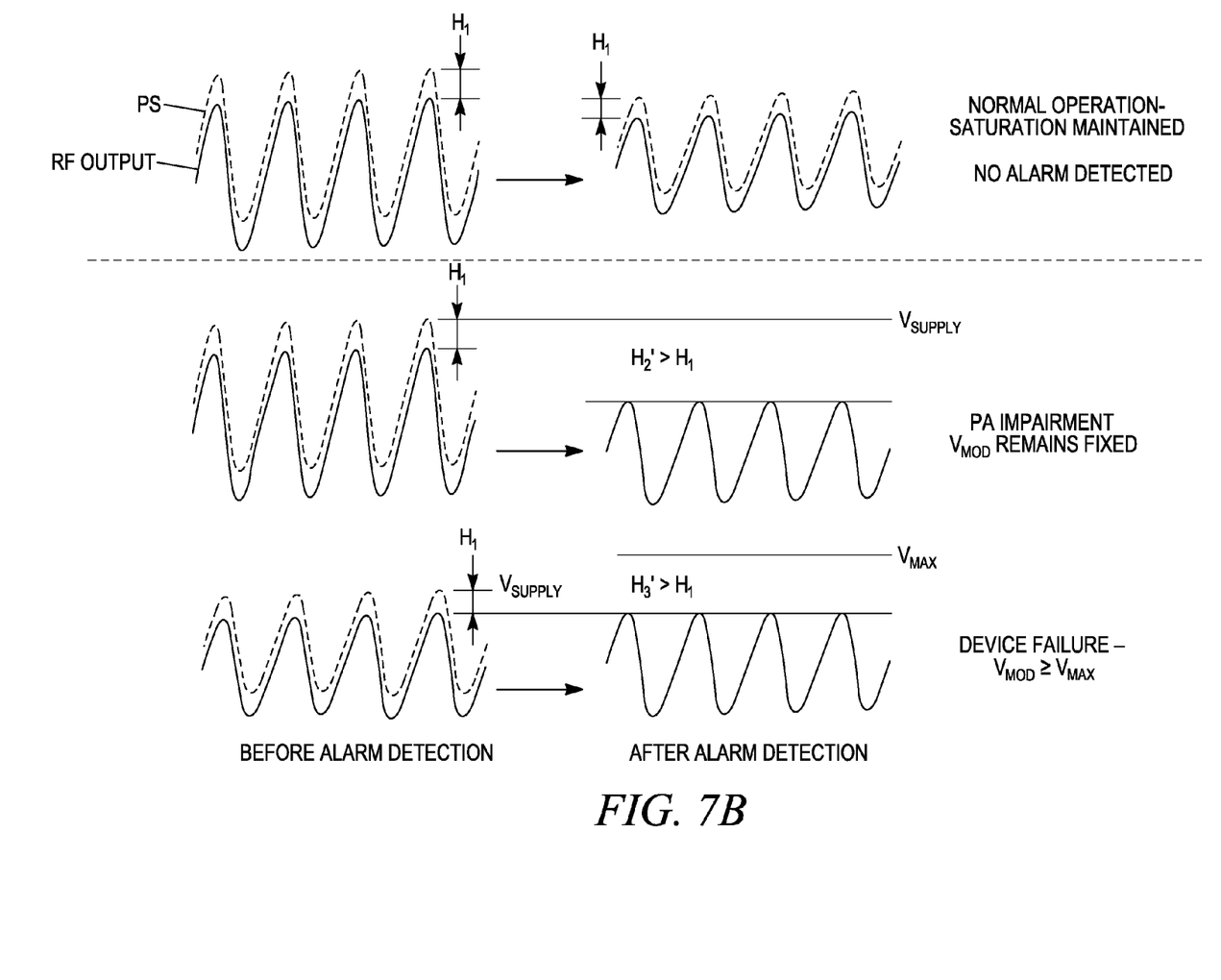

In another embodiment shown in FIG. 7B, when impairment of the RFPA is detected, the power supply voltage is maintained at the level of the maximum voltage during the previous cycle even though the RF input signal voltage has decreased (i.e. at $V_{supply}$). Although the power supply voltage is no longer modulated, again, a sufficient amount of headroom is provided even when the RF input signal is at a maximum so that the RFPA does not near saturation. Similarly, when a fault in the RFPA is detected, the power supply voltage is no longer modulated but is permanently maximized to the rail voltage independent of the RF input signal voltage.

Figure 8:
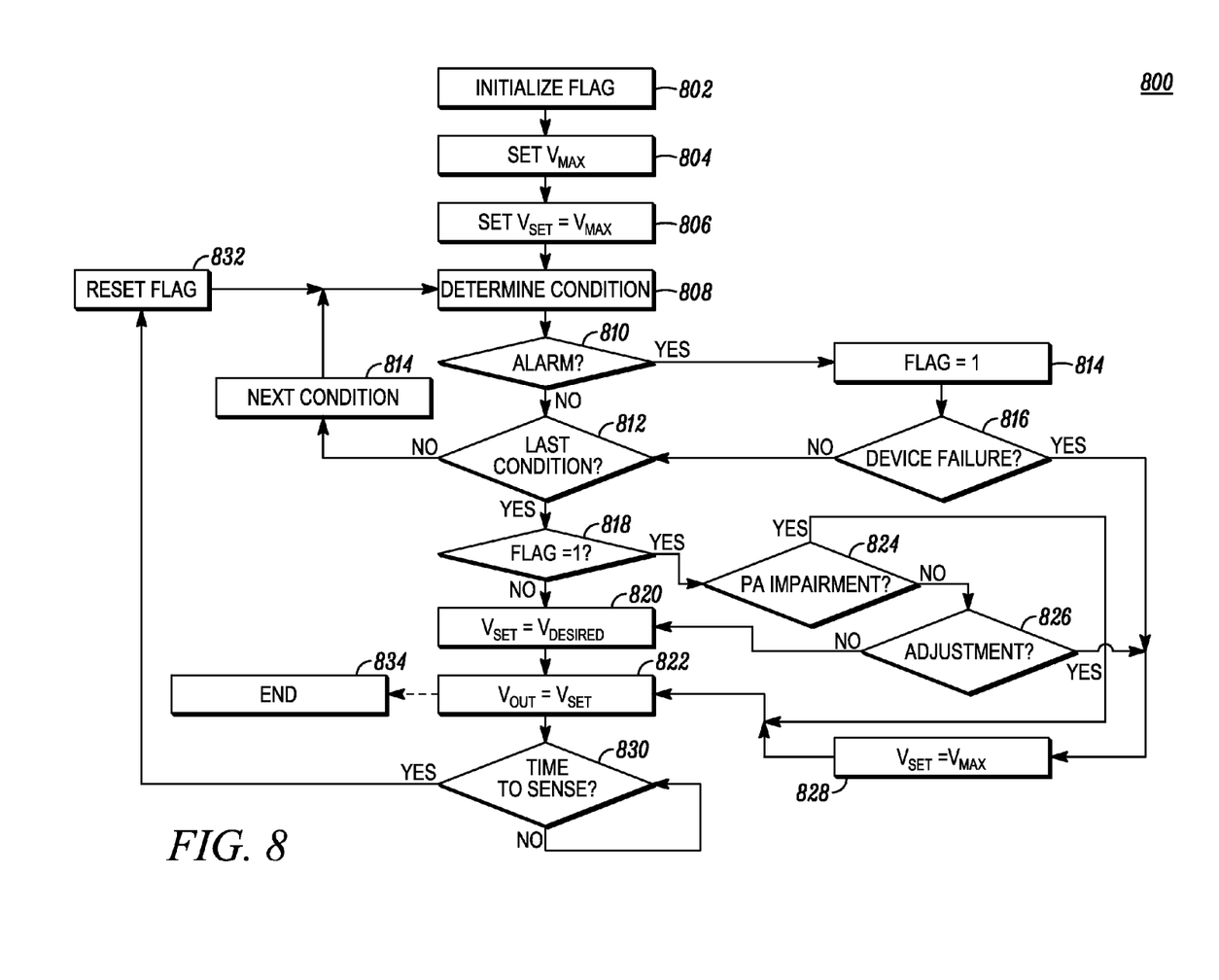
FIG. 8 illustrates a flowchart of an embodiment of a method of power supply modulation in the communication device.

A flowchart of a method of operation of the power supply modulation is shown in FIG. 8. The method 800 starts by initializing a flag at step 802. The flag is changed from its initial value to indicate that an alarm has occurred. The maximum power supply voltage is then established at step 804 and the set voltage set at the maximum power supply voltage at step 806. The parameter is detected at step 808. It is then decided whether an alarm has occurred at step 810. If at step 810 an alarm is not registered at the present parameter, then the method cycles through the remaining parameters by (at step 812) determining whether all parameters have been checked during the present cycle (i.e., all of the signals being cycled through and checked using the PA monitor) and if not selecting the next parameter at step 814 for determination.

If at step 810 the presence of an alarm is registered at the present parameter, then the alarm flag is set at step 814 and at step 816 it is determined whether a fault (device failure) has occurred. If at step 816 when it is determined that a fault has not occurred, the process returns to step 812 where it is determined whether all parameters have been cycled through for the presence of an alarm. If at step 816 it is determined that a fault has occurred, the set voltage is set to the maximum power supply voltage or headroom, depending on the embodiment, at step 828 before adjusting the modulated output voltage at step 822. The process then either waits until the next cycle (as shown) or terminates thereafter, thereby e.g. terminating modulation of the power supply voltage until the communication device is reset by replacement of the component that has failed as shown by the dashed line leading to end 834.

Once it is determined that at step 812 that the last parameter has been reached, it is then determined at step 818 whether the flag has been set (i.e., an alarm exists). If it is determined at step 818 that the flag has not been set during the current cycle, at step 820 the input RF signal is used to establish the set voltage and at step 822 the power supply voltage (Vout) is set to the set voltage. Thus, in this case, the power supply voltage is modulated using the input RF signal such that the RFPA remains near saturation for all RF input signals. If, however, it is determined at step 818 that the flag has been set during the current cycle, appropriate action is taken.

When it is determined at step 818 that the flag has been set during the current cycle, at step 824 whether impairment of the RFPA has occurred is determined If so, at step 822 the power supply voltage is, in the embodiment shown in FIG. 7B for example, "frozen" at the level of the last cycle, before the impairment was detected. Thus, rather than using the power supply voltage modulated using the RF input of the current cycle (Vout=Vdesired), the power supply voltage of the last cycle is used (Vout=Vdesired from the last cycle). Alternatively, as shown in the embodiment of FIG. 7A, the power supply voltage during the current cycle is modulated to maintain an increased amount of headroom, which is frozen and set by the difference between the maximum of the RF input signal and the power supply voltage.

If, at step 824, it is determined that impairment of the RFPA has not occurred, but a non-fault alarm has occurred, it is determined at step 826 whether it is desirable to adjust the power supply voltage. If not (one such example being a VSWR alarm), although an alarm parameter may be indicated by the display, no action is taken to change either the power supply voltage or the manner in which it is modulated. Thus, in FIG. 8, the process reverts to step 820. If however, at step 826, it is determined that adjustment of the power supply voltage is desired due to the non-fault, non-impairment alarm, at step 828 the set voltage is set to the maximum supply voltage and the process returns to step 822, where the power supply voltage is then set to the set voltage (and thus maximized) similar to if a fault had been determined.

After setting the power supply voltage or headroom to the particular value established during the current cycle, the process waits at step 830 until it is time to begin the new alarm detection cycle. At this point, the alarm flag is cleared 832 so that if a false alarm occurred during the last cycle or the parameter causing the alarm has been alleviated, normal modulation of the power supply voltage is effected so that the RFPA again operates near saturation. The alarms are ranked such that if different types of alarms exist, response to a fault occurs first, then other alarms in which the power supply voltage characteristics are maximized, and then impairment.

Although only one embodiment of the process 800 has been shown in FIG. 8, other variations are possible. For example, once a fault has been determined at step 816, the process may terminate entirely until the damaged component in the communication device is manually repaired or replaced. In this case, the alarm may be constantly displayed on the transmitter and no further cycling through parameters occur as the power supply voltage will be set to the maximum power supply voltage (no modulation will occur). Alternatively, modulation may continue, but the maximum power supply voltage may be set to a constant (e.g., the rail voltage or predetermined voltage higher than the optimal voltage). Also, the order of determination of the type of alarm may be altered from that shown in FIG. 8 (i.e., fault, impairment, other).

Thus, in one embodiment all of the parameters are continuously cycled through for all types of alarms, independent of whether an alarm is present. In another embodiment, once an alarm has been detected, the other parameters are no longer reviewed to determine whether the same type of alarm (e.g., impairment) is present until the detected alarm is cleared, although detection of other types of alarms may continue when cycling through these parameters. In another embodiment, if a fault is detected, the process terminates until the fault is cleared (i.e., by an operator that replaces the damaged component). In this case, no further alarms of any type are looked for until the fault is cleared. Thus, review of the alarms may be prioritized so that it is first determined whether a fault exists and only afterwards (if no fault is found) is it determined whether an impairment exists.

The system may contain a single RFPA, as shown in FIGS. 4-6, or a multi-stage amplifier. In the latter case, then modulation of the power supply voltage is provided at the final stage, the RFPA. Feedback circuitry may be used in some but not all embodiments. The modulation may be enabled by a predetermined function implemented in software, hardware or a combination thereof. Moreover, when referring to any software implementation described herein, it should be understood by those skilled in the art that the embodiments described in the teachings herein may likewise be implemented in firmware without departing from these teachings.

Although only one power amplifier stage is shown, the transmitter may contain multiple parallel power amplifier stages. In this case, the same modulated supply voltage would be used for each parallel amplifier. Similar to the other embodiments, the information of the alarms may come from the individual parallel amplifiers in the transmitter, the PA monitor block, or directly from the FPGA. The above method is modified such that the appropriate action would be taken if one of the parallel amplifiers in the RPFA were to become impaired or have a fault.

In each of the above embodiments, the input RF signal is assumed to be a modulated signal. However, the input signal may also comprise of a multi-carrier signal or a slotted signal. The slotted signal can comprise at least one off slot or a lower power slot in addition to the slots carrying modulated data. As appreciated by one of skill in the art, alarming in a supply modulated system is independent of the modulated signal to be transmitted and thus an arbitrary transmitted modulated signal may be used without affecting the overall performance of alarming.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure and Summary section are provided to allow the reader to quickly ascertain the nature of the technical disclosure. It is submitted with the understanding that neither will be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

Those skilled in the art will recognize that a wide variety of modifications, alterations, and combinations can be made with respect to the above described embodiments without departing from the spirit and scope of the invention and that such modifications, alterations, and combinations are to be viewed as being within the scope of the inventive concept. Thus, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims issuing from this application. The invention is defined solely by any claims issuing from this application and all equivalents of those issued claims.

The invention claimed is:

1. A method of controlling a power supply voltage supplied to a power amplifier, the method comprising:
   monitoring a plurality of parameters of the power amplifier over a cycle;
   for each parameter, detecting whether an alarm condition has occurred based on the parameter being outside of an expected predetermined range;
   modulating the power supply voltage supplied to the power amplifier dependent on an output signal of the power amplifier if no alarm has been detected;
   if at least one alarm has been detected, determining the type of the at least one alarm; and
   adjusting characteristics of the power supply voltage supplied to the power amplifier differently based on the type of alarm detected, wherein the types of alarms include a fault and an impairment of the power amplifier and adjusting the power supply voltage characteristics comprises:
      increasing the power supply voltage characteristics of the power supply voltage supplied to the power amplifier if a fault has been detected; and
      maintaining the power supply voltage characteristics of the power supply voltage supplied to the power amplifier from a previous cycle if an impairment has been detected.

2. The method of claim 1, wherein:
   adjusting the power supply voltage characteristics further comprises stopping modulation of the power supply voltage supplied to the power amplifier;
   increasing the power supply voltage characteristics comprises setting the power supply voltage supplied to the power amplifier to a voltage higher than an optimal voltage; and
   maintaining the power supply voltage characteristics comprises maintaining the power supply voltage supplied to the power amplifier from the previous cycle.

3. The method of claim 1, wherein:
   increasing the power supply voltage characteristics comprises modulating the power supply voltage supplied to the power amplifier such that an amount of headroom between a rail voltage and a maximum of the output signal is maintained; and
   maintaining the power supply voltage characteristics comprises modulating the power supply voltage supplied to the power amplifier such that an amount of headroom between the power supply voltage supplied to the power amplifier from the previous cycle and a maximum of the output signal is maintained.

4. The method of claim 1, further comprising ranking a fault higher than an impairment such that if a fault and impairment are both determined to be present, the power supply voltage characteristics of the power supply voltage supplied to the power amplifier are maximized or an amount of headroom between a rail voltage and a maximum of the output signal is maintained.

5. The method of claim 4, wherein the amount of headroom maintained if an impairment has been detected is the amount of headroom provided in the cycle immediately preceding the cycle in which the impairment is detected.

6. The method of claim 1, wherein a fault is permanent, the method further comprising if a fault has been determined, terminating: the detection of the alarm, the determination of the type of the at least one alarm, and the adjustment of the modulation, until the fault has been corrected.

7. The method of claim 6, the method further comprising terminating the modulation of the power supply voltage supplied to the power amplifier if a fault has been determined.

8. The method of claim 1, further comprising linking display of the at least one alarm with adjustment of the power supply voltage characteristics of the power supply voltage supplied to the power amplifier such that the power supply voltage characteristics of the power supply voltage supplied to the power amplifier are adjusted only if the at least one alarm is displayed by a communication device containing the power amplifier.

9. The method of claim 1, further comprising displaying that the at least one alarm is present on a display of a communication device containing the power amplifier independent of whether the power supply voltage characteristics of the power supply voltage supplied to the power amplifier are adjusted due to the at least one alarm.

10. The method of claim 9, wherein detecting whether an alarm has occurred comprises cycling through all of the parameters and comparing each parameter to a unique predetermined range stored in a memory of a power amplifier module containing the power amplifier.

11. The method of claim 1, wherein the types of alarm include a fault and impairment of the power amplifier, the method determines whether a fault is present before determining whether an impairment is present and, if a fault is determined, terminating detection of all types of alarms for all parameters until the fault is cleared.

12. The method of claim 1, further comprising terminating detection of a particular type of alarm for the parameters, while continuing detection of other types of alarms for the parameters, once the particular type of alarm has been detected for one of the parameters until the particular type of alarm is cleared.

13. A communication device comprising:
a transmitter module containing a transmitter processor; and
a power amplifier module independent from the transmitter module containing:
a power amplifier configured to amplify an RF input signal into an RF output signal;
a modulator configured to control power supply characteristics of a power supply voltage supplied to the power amplifier, the modulator configured to modulate the power supply voltage supplied to the power amplifier dependent on the RF output signal if no alarm has been detected;
a monitor configured to monitor parameters of the power amplifier and provide the parameters to the transmitter processor for detecting whether an alarm condition has occurred based on one of the parameter being outside of an expected predetermined range;
a diagnostic module configured to receive a signal from the transmitter processor; and
a power amplifier module processor configured to receive an envelope signal of the RF input signal from the transmitter processor and a signal dependent on the existence of an indicated alarm and, in response, controls the power supply characteristics of the power supply voltage supplied to the power amplifier differently based on the type of indicated alarm, wherein the types of alarm include a fault and an impairment of the power amplifier and the power amplifier module processor is configured to control the power supply voltage characteristics of the power supply voltage supplied to the power amplifier by:
maximizing the power supply voltage characteristics of the power supply voltage supplied to the power amplifier if a fault exists; and
maintaining the power supply voltage characteristics of the power supply voltage supplied to the power amplifier from a previous cycle if an impairment exists.

14. The communication device of claim 13, wherein to control the power supply characteristics the power amplifier module processor is configured to:
stop modulation of the power supply voltage supplied to the power amplifier;
maximize the power supply voltage characteristics of the power supply voltage supplied to the power amplifier by setting the power supply voltage supplied to the power amplifier to a rail voltage if a fault exists; and
maintain the power supply voltage characteristics of the power supply voltage supplied to the power amplifier by maintaining the power supply voltage supplied to the power amplifier from the previous cycle if an impairment exists.

15. The communication device of claim 13, wherein to control the power supply characteristics the power amplifier module processor is configured to:
maximize the power supply voltage characteristics of the power supply voltage supplied to the power amplifier by modulating the power supply voltage supplied to the power amplifier such that an amount of headroom between a rail voltage and a maximum of the RF input signal is maintained if a fault exists; and
maintain the power supply voltage characteristics of the power supply voltage supplied to the power amplifier by modulating the power supply voltage supplied to the power amplifier such that an amount of headroom between the power supply voltage from the previous cycle and a maximum of the RF input signal is maintained if an impairment exists.

16. The communication device of claim 13, wherein the types of alarm include a fault and an impairment of the power amplifier and wherein to control the power supply characteristics the power amplifier module processor is configured to rank a fault higher than an impairment such that if a fault and impairment are both determined to be present, the power supply voltage characteristics of the power supply voltage supplied to the power amplifier are maximized.

17. The communication device of claim 13, further comprising a display indicating the type of alarm, the display and the power amplifier module processor configured to receive the signal dependent on the existence of an alarm from the diagnostic module, the signal dependent on the existence of an alarm indicating the type of alarm.

18. The communication device of claim 13, further comprising a display indicating the type of alarm, the display configured to receive a signal indicating the type of alarm from the diagnostic module while the modulator is configured to receive the signal dependent on the existence of an alarm from the monitor or power amplifier.

* * * * *